United States Patent [19]

Rozario et al.

[11] Patent Number: 4,550,265
[45] Date of Patent: Oct. 29, 1985

[54] DRIVER FOR VOLTAGE CONTROLLED ATTENUATOR

[75] Inventors: Novellone Rozario, Jericho; Lawrence H. Silverman, Dix Hills, both of N.Y.

[73] Assignee: General Instrument Corp., Clifton, N.J.

[21] Appl. No.: 416,863

[22] Filed: Sep. 13, 1982

[51] Int. Cl.[4] ............................................. G06G 7/12
[52] U.S. Cl. ..................... 307/494; 307/261; 307/310; 307/358; 307/503
[58] Field of Search .............. 307/490, 491, 494, 498, 307/503, 310, 261, 358; 330/149; 328/142, 143; 333/81 R, 81 A, 81 B

[56] References Cited

U.S. PATENT DOCUMENTS

| | | | |
|---|---|---|---|
| 3,333,180 | 7/1967 | Neu | 307/261 |
| 3,813,561 | 5/1974 | Williams et al. | 307/490 |
| 4,339,727 | 7/1982 | Kage et al. | 307/358 |

Primary Examiner—John Zazworsky
Attorney, Agent, or Firm—James & Franklin

[57] ABSTRACT

For use with a voltage controlled attenuator operating at microwave frequencies, the driver generates an output signal which is a non-linear function of an input voltage signal. The input stage includes a thermistor to alter the input signal to compensate for temperature variations. The temperature compensated signal is delinearized by parallelly connected diodes which separately selectively ground the output of the input stage at different potential levels defined by resistor networks. A differential amplifier generates a signal which is a function of the difference between the compensated input signal and the delinearized signal. The output stage generates an output voltage which is a function of the difference signal. The output voltage regulates a current source. The output of the current source is applied to the attenuating PIN diodes.

17 Claims, 11 Drawing Figures

DRIVER FOR VOLTAGE CONTROLLED ATTENUATOR

The present invention relates to a driver for an attenuator and, more particularly, to a driver for a voltage controlled attenuator operating at microwave frequencies which provides a linear relationship between the driver input voltage and the attenuation, over a wide temperature range, is relatively immune to power supply variations, and which requires no tuning.

An attenuator is an electronic device which attenuates electromagnetic energy. The degree of attenuation is controlled by an input signal. The driver of the present invention is designed for use with an attenuator operating in the microwave region (2–18 GHz). Such an attenuator includes one or more P-intrinsic-N (PIN) diodes which are current controlled. In order to generate the current control signal for the PIN diodes, the attenuator includes or is used in conjunction with a voltage controlled current source. The function of the driver is to generate an output voltage signal to control the current source which will provide a linear relationship between the driver input voltage and the attenuation produced by the PIN diodes. For example, the attenuation may vary linearly from 0 to 60 dB as the driver input voltage varies from 0 to 6 volts.

The relationship between the control current input to the PIN diodes and the degree of attenuation is not linear because of the non-linear nature of the PIN diodes. Accordingly, it is necessary that the driver compensate for the non-linearity of the characteristic of the PIN diodes by producing an output voltage for controlling the current source which is itself non-linear. In conventional drivers, the non-linear output voltage is obtained by generating a signal which has an inverse relationship with the input signal and then generating an intermediate voltage signal, which is a non-linear function of the inverse signal. The intermediate signal is then subtracted from a constant reference voltage, in order to obtain the output signal.

The method used in conventional drivers creates certain problems. Because of the inverse relationship between the input voltage signal and the first intermediate voltage, the portion of the output signal which corresponds to the lower input voltages is determined after the portion of the output signal which corresponds to the higher input voltages. Moreover, the reference voltage level is dependent on the power supply which is connected through a resistance network and, consequently, is subject to power supply variations. It is therefore difficult to properly tune the circuit such that a zero volt input signal results in a zero volt output signal and, at the same time, obtain the required linear relationship between the driver input voltage and the attenuation.

In addition, in conventional drivers, ambient temperature variations alter the relationship between the attenuation and the current which controls the PIN diodes. It is therefore desirable that the driver itself be temperature sensitive such that the output signal is automatically adjusted to compensate for temperature variations. Moreover, the driver must function adequately over a relatively wide temperature range, for example, from $-55°$ C. to $+71°$ C., and the temperature compensation must be done in a simple, inexpensive and reliable manner.

The present invention eliminates the tuning problems present in conventional drivers by providing the necessary input voltage versus output current relationship without requiring any tuning. Instead of a constant reference voltage, a temperature compensated linear function of the input voltage is used as a reference for the subtraction. All transformations in the driver are based on a single power supply so as to minimize deviations due to power source variations. Moreover, the unique structure of the driver inherently generates a zero output for a zero input, as well as the desired functional relationship, without the necessity for tuning. Only calibration is required during set up to match the characteristics of the driver to the particular attenuator being used.

A thermistor is utilized at the input stage of the driver to provide temperature compensation in a very simple manner. The result is a driver which provides a stable temperature compensated non-linear output voltage. This output voltage controls the current source to generate a control current for the PIN diodes in a manner which achieves the desired linear relationship between the driver input voltage and the attenuation.

It is, therefore, a prime object of the present invention to provide a driver for a voltage controlled attenuator operating at microwave frequencies which compensates for the non-linear characteristic of the PIN diodes.

It is another object of the present invention to provide a driver for a voltage controlled attenuator wherein the output signal is zero when the driver input voltage is zero and wherein this feature is inherent in the circuit.

It is another object of the present invention to provide a driver for a voltage controlled attenuator wherein the necessity for tuning is eliminated.

It is another object of the present invention to provide a driver for a voltage controlled attenuator in which ambient temperature variations are automatically compensated for in a simple manner.

It is another object of the present invention to provide a driver for a voltage controlled attenuator in which the effects of power supply variations are reduced to a minimum.

In accordance with the present invention, apparatus is provided for generating an output signal which is a non-linear function of an input signal. The apparatus comprises input means for receiving the input signal. Means, operably connected to the input means, are provided for generating a signal which is a non-linear function of the input signal. Means are provided for generating a signal which is a function of the difference between the input signal and the non-linear signal. Output means are provided for generating an output signal which is a function of the difference signal.

The non-linear signal generating means comprises means operably connected between the output of the input means and a reference source for conditionally operably connecting the output of said input means to the reference source.

The conditional connecting means comprises means having first and second terminals operably connected between the output of the input means and a reference source. The conditional connecting means is adapted to become conductive when the potential at the first terminal and the potential at the second terminal are in a given relationship. Means are provided for establishing the potential at the second terminal.

The conditional connecting means preferably comprises a plurality of parallelly connected means, each having first and second terminals connected between the output of the input means and the reference source, respectively. Each of the plurality of means is adapted to become conductive when the potential at the first terminal thereof and the potential at the second terminal thereof are in a given relationship. Means are provided for establishing the potential at each of the second terminals. The potential establishing means establishes a different potential at each of the second terminals.

The input means comprises an input node operably connected to receive the input signal and means for isolating said non-linear signal generating means from said input node. The isolating means preferably comprises an operational amplifier having first and second inputs and an output. The first input is operably connected to the input node and said second input is operably connected in feedback relationship to the output of the operational amplifier.

The input means further comprises means for compensating for temperature variations. This means is operably connected between the input node and the first input of the operational amplifier and serves to alter the input signal to compensate for ambient temperature variations.

The non-linear signal generating means comprises means operably connected to the output of the input means for generating a non-linear function of the input signal and means for isolating the non-linear signal generating means from the difference signal generating means. The isolating means preferably comprises an operational amplifier having first and second inputs and an output. The first input is operably connected to receive the non-linear function and the second output is operably connected in feedback relation with the output.

The difference signal generating means comprises a differential amplifier having first and second inputs operably connected to receive the outputs of the input means and the non-linear signal generating means, respectively.

The output means comprises means for generating a zero output signal when the different signal is zero. This means comprises an operational amplifier having first and second inputs and means associated with the inputs for maintaining the inputs at substantially equal potentials when the difference signal is zero. This means comprises first and second pairs of resistors. One resistor in each pair is operably connected between a positive source and a different input of the operational amplifier. The second resistor in the first pair is operably connected between the output of the difference signal generating means and one input of the operational amplifier. The second resistor in the second pair is operably connected between the reference source and the second input of the operational amplifier. The ratio of the values of the resistors in each pair of substantially equal to each other.

The apparatus is designed for use with a signal controlled current source having an output node and including transistor means having a control terminal and an output circuit. The apparatus further comprises means for operably connecting the output of the output means to the control terminal of the transistor means. In addition, means are provided for operably connecting the transistor means output circuit between the second input of the operational amplifier and the output node.

The apparatus is designed for use with a current controlled attenuator comprising a PIN diode and further comprises means for operably connecting the output node of the current source to the PIN diode.

To these and to such other objects as may hereinafter appear, the present invention relates to a driver for a voltage controlled attenuator as described in the following specification and recited in the annexed claims, taken together with the accompanying drawings, wherein like numerals refer to like parts, and in which:

Figure 1:
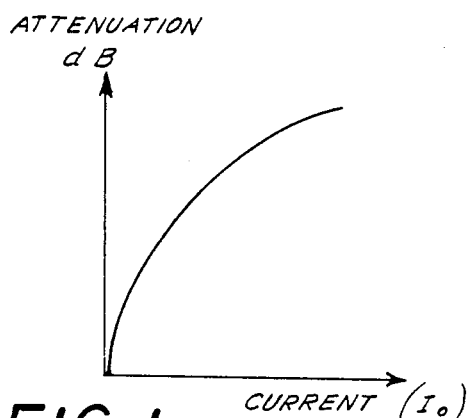
FIG. 1 is a graphical representation of the relationship between the attenuator control current and the attenuation, for a conventional microwave attenuator.
Figure 2:
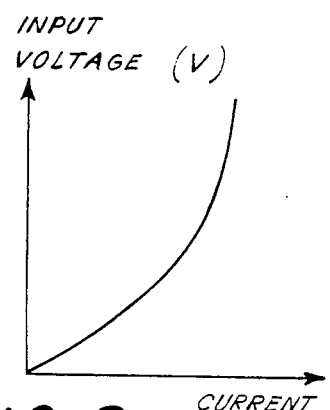
FIG. 2 is a graphical representation of the relationship between the output current and the input voltage of the wave shaping section of a conventional driver for an attenuator.
Figure 5:
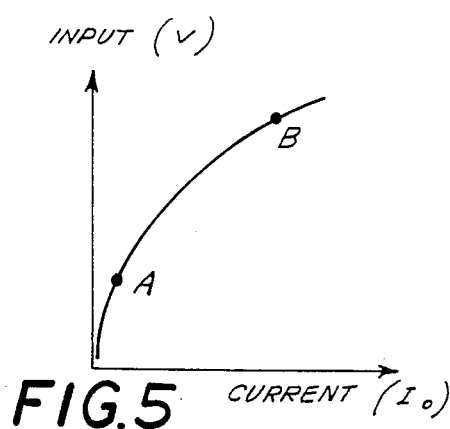
FIG. 5 is a graphical representation of the relationship between the driver input voltage (V) and the attenuator control current ($I_0$) in a conventional driver.
Figure 8:
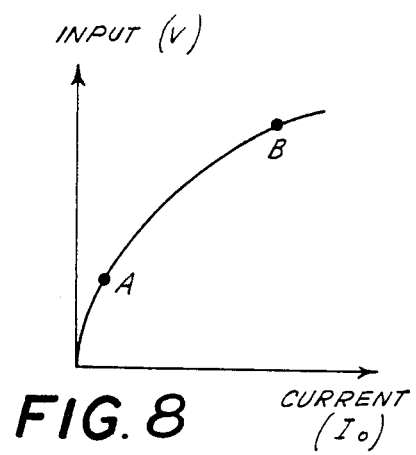
FIG. 8 is a graphical representation of the relationship between the attenuator control current and the driver input voltage in the driver of the present invention.

An attenuator designed for use in the microwave region (2-18 GHz) employs one or more PIN diodes which are current controlled. The relationship between the attenuator control current ($I_o$) and the attenuation (in decibels) for such an attenuator is illustrated in FIG. 1. This relationship is a result of the inherent characteristics of the PIN diodes employed in the attenuator and is non-linear. The function of a driver is to provide a control voltage to a current source which, in turn, will generate an attenuator control current for the PIN diodes which will result in a linear relationship between the driver input voltage and the attenuation. In order to do this, the relationship between the driver input voltage and the attenuator control current must be non-linear in a manner which compensates for the non-linear characteristic of the PIN diodes. The desired relationship is illustrated in FIGS. 5 and 8.

In a conventional driver, the wave shaping section employs diodes which have a non-linear input voltage versus output current relationship, as illustrated in FIG.

Figure 3:
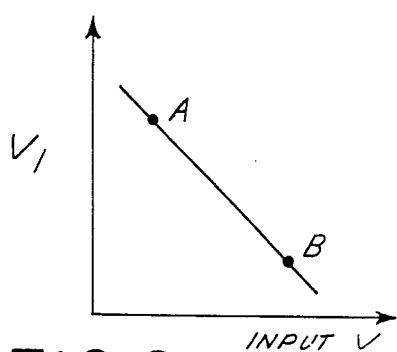
FIG. 3 is a graphical representation of the relationship between the input voltage signal and a first intermediate voltage ($V_1$) generated by a conventional driver.

2. In order to obtain the required driver input voltage versus control current relationship, illustrated in FIG. 5, a first intermediate voltage signal ($V_1$) is generated. As illustrated in FIG. 3, the relationship between the driver input voltage (V) and the first intermediate voltage ($V_1$) is linear but inverse, that is, as the input voltage (V) gets higher, the first intermediate voltage ($V_1$) gets lower, and vice versa. Point A denotes a point on the V versus $V_1$ curve where the input voltage (V) is low. Point B denotes a point on the V versus $V_1$ curve where the input voltage (V) is high.

Figure 4:
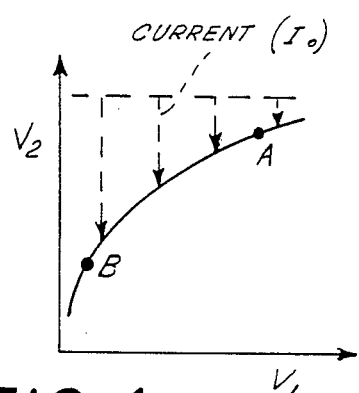
FIG. 4 is a graphical representation showing the manner in which a subtraction operation is performed to obtain the attenuator control current in a conventional driver.

The first intermediate voltage $V_1$ is then delinearized to form a second intermediate voltage ($V_2$). The relationship between $V_1$ and $V_2$ is shown in FIG. 4. In order to obtain the control current ($I_o$), the $V_1$ versus $V_2$ curve is subtracted from a constant reference voltage, illustrated as a dashed horizontal line in FIG. 4. The result of the subtraction is a voltage signal which is converted into the control current. The resulting input voltage versus control current characteristic is illustrated in FIG. 5.

A comparison of FIGS. 3, 4, and 5 shows that, because of the inverse relationship between V and $V_1$, point B on the $V_1$ versus $V_2$ curve will be obtained before point A. In other words, a low input voltage (V) will result in a high second intermediate voltage ($V_2$) and a high input voltage (V) will result in a low second intermediate voltage ($V_2$). This, coupled with the fact that the constant reference voltage, from which the $V_1$ versus $V_2$ curve is subtracted to obtain the control current, is obtained by connecting a power source through a resistor network and, consequently, is highly dependent upon variations in the power supply, makes it necessary to tune the conventional driver in order to obtain the required linear relationship between the driver input voltage and the attenuation, and, at the same time, insure that a zero volt driver input voltage will result in a zero dB attenuation. In other words, tuning of the conventional driver is required to obtain the curve illustrated in FIG. 5, which passes through the intersection of the X and Y axis, such that a zero volt input always results in a zero control current output.

Figure 6:
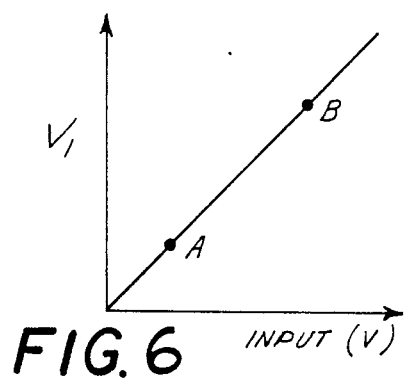
FIg. 6 is a graphical representation of the relationship between the driver input voltage (V) and a first intermediate voltage ($V_1$) in the driver of the present invention.
Figure 7:
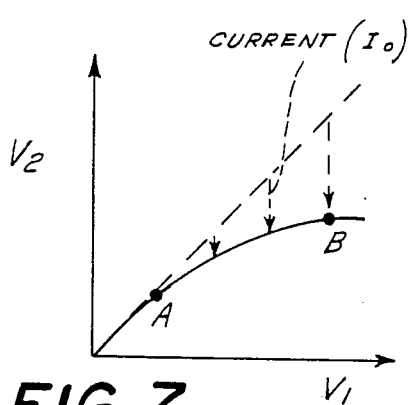
FIG. 7 is a graphical representation showing the manner in which the subtraction operation is performed to obtain the attenuator control in the driver of the present invention.

FIGS. 6, 7, and 8 graphically illustrate the operation of the driver of the present invention. In the present invention, the desired relationship is obtained, but tuning of the circuit is entirely eliminated because the circuit inherently generates a zero attenuator control current ($I_o$) when a zero volt driver input voltage (V) is present. These objectives are achieved by using the input voltage itself as the basis for the reference for subtraction, instead of the constant voltage reference, and by employing a single supply voltage source such that all transformations in the circuit are affected equally by supply voltage variations and by employing a unique output stage to insure that zero input always results in zero output.

FIG. 6 shows that there is a direct linear relationship between the driver input voltage (V) and the first intermediate voltage ($V_1$). Thus, a low driver input voltage results in a low first intermediate voltage and a high driver input voltage results in a high first intermediate voltage. FIG. 7 illustrates the relationship between the first intermediate voltage ($V_1$) and the second intermediate voltage ($V_2$). As illustrated in FIG. 7, the attenuator control current ($I_o$) in the present invention is obtained by subtracting the $V_1$ versus $V_2$ curve from the V versus $V_1$ curve, the latter of which is represented by the dashed diagonal line, instead of a constant reference voltage.

In the present invention, point A is determined prior to point B, in contrast to the conventional driver. By generating the lower portions of the $V_1$ versus $V_2$ curve in response to lower input voltages V, by eliminating the constant voltage used in conventional drivers as a basis for the subtraction and by using a single power source for all transformations, the desired driver input voltage versus control current output characteristic is achieved. It should be noted that the output curve passes through the intersection of the X axis and the Y axis, as illustrated in FIG. 8, without the necessity for tuning the circuit.

Figure 9:
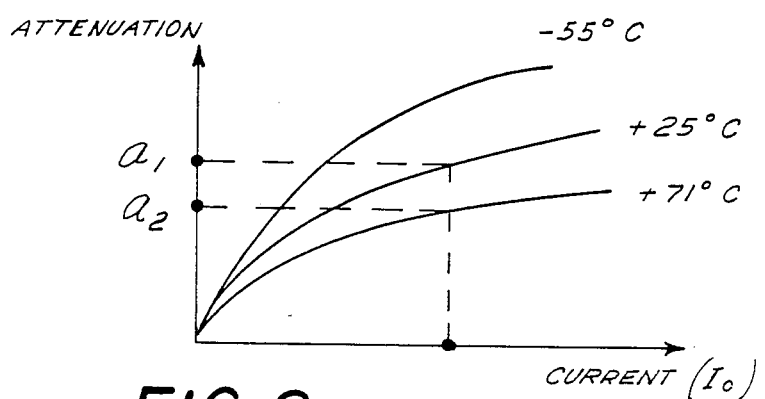
FIG. 9 is a graphical representation of the manner in which temperature variations affect the attenuation control current versus attenuation relationship in an attenuator.

FIG. 9 illustrates the manner in which the attenuator control current versus attenuation curve varies with variations in ambient temperature. The three separate curves show the curve at $-55°$ C., $+25°$ C., and $+71°$ C., respectively. It is apparent that the position of the curve varies considerably over the normal temperature operating range of the attenuator. It is therefore necessary for the driver to compensate for these variations. As explained in detail below, temperature compensation is achieved in the present invention in a simple and reliable manner by using a thermistor to alter the intermediate voltage ($V_1$) in a manner which automatically compensates for ambient temperature variations.

Figure 10:
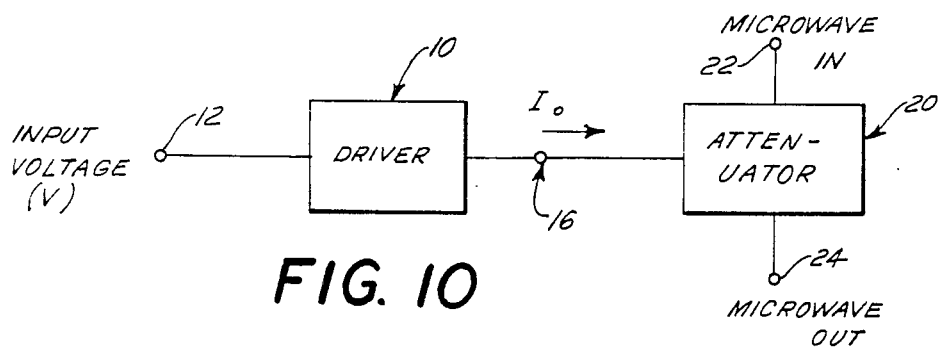
FIG. 10 is a block diagram showing the manner in which the driver of the present invention is connected to a microwave attenuator.

FIG. 10 illustrates the manner in which the driver of the present invention is connected to the attenuator. The driver, generally designated 10, has an input node 12 to which the driver input voltage (V) is applied. The output of the driver is connected to a controllable current source, generally designated 16, which, in turn, generates the attenuator control current ($I_o$) to the PIN diodes within the attenuator, generally designated 20. Attenuator 20 has a microwave input 22 and a microwave output 24. Microwave energy is applied to microwave input 24, attenuated by attenuator 20, and the attenuated energy is obtained at output 24.

Figure 11:
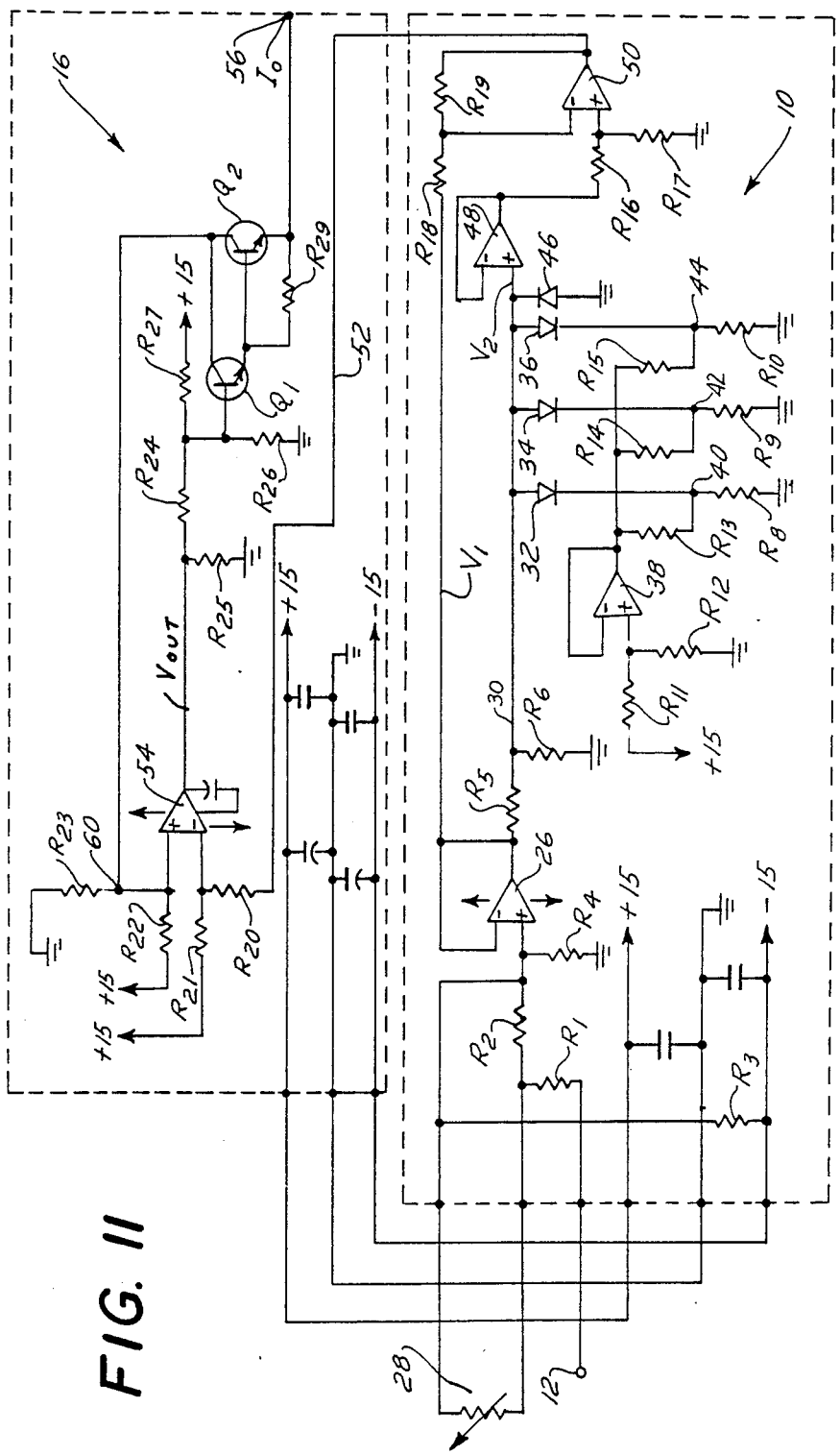
FIG. 11 is a schematic diagram of the driver of the present invention.

FIG. 11 is a schematic diagram of the driver, generally designated 10, of the present invention and the current source, generally designated 16, used in conjunction with the driver to generate the attenuator control current ($I_o$). The current source illustrated is of conventional design and may be substituted with any comparable known source.

The input voltage (V) is applied to node 12 of driver 10. The input voltage (V) typically varies between 0 and 6 volts and the current source typically generates an attenuator control current ($I_o$) in the range of zero to between 10 and 15 milliamps in response thereto. Input node 12 is connected to the positive input of a first operational amplifier 26 of conventional design, through a resistor $R_1$ and resistor $R_2$. A thermistor 28 is connected in parallel with resistor $R_2$. The positive input of operational amplifier 26 is also connected to a source of negative potential (31 15 v) through resistor $R_3$ and to ground through a resistor $R_4$. Resistor $R_3$ is a very large resistor, in the order of 1 megohm, such that detrimental effects due to tolerances of the resistance values may be offset. Amplifier 26 serves to isolate the input section of the driver from the non-linear function forming circuit described below.

The output of operational amplifier 26 is connected in feedback relation to the negative input thereof. When connected in this manner, the output of operational amplifier 26, which is the first intermediate voltage ($V_1$), is a linear function of the input voltage (V), as adjusted by thermistor 28 to compensate for ambient temperature variations. This relationship is illustrated in FIG. 6. Operational amplifier 26 has a very large input impedance such that there is virtually no load on the input.

The output of operational amplifier 26 passes through a resistor $R_5$ to line 30 which is connected to ground through resistor $R_6$. Connected to line 30 is a means for generating the second intermediate signal ($V_2$) which is a non-linear function of the output ($V_1$) of operational amplifier 26. This circuit comprises a plurality of parallel branches (three are shown) connected between line 30 and ground. Each branch includes a diode 32, 34, 36 which is connected in series with a resistor $R_8$, $R_9$, and $R_{10}$, respectively.

A second operational amplifier 38 is provided which, in conjunction with the resistors, controls the diodes 32, 34, and 36 to become conductive at different levels of $V_1$ to form the non-linear function. Amplifier 38 has its positive input connected through a resistor $R_{11}$ to a source of positive potential (+15 v). The positive input is also connected to ground through a resistor $R_{12}$. The negative input of operational amplifier 38 is connected in feedback relation to the output of the amplifier. The output of amplifier 38 is connected to each of the branches of the parallel circuit through resistors $R_{13}$, $R_{14}$, and $R_{15}$, respectively. Resistor $R_{13}$ is connected to resistor $R_8$ and diode 32 through node 40. Similarly, resistor $R_{14}$ is connected to resistor $R_9$ and diode 34 through node 42 and resistor $R_{15}$ is connected to resistor $R_{10}$ and diode 36 through node 44.

Considering the first branch of the parallel circuit, if the potential at line 30 is greater than the potential at node 40, diode 32 will be conductive, thereby connecting line 30 to ground through resistor $R_8$. Similarly, in the second branch, as the potential at line 30 increases to a level greater than the potential at node 42, diode 34 will also become conductive, thereby connecting line 30 to ground through resistor $R_9$. In the third branch, as the potential on line 30 further increases to a level greater than the potential at node 44, diode 36 will also become conductive and connect line 30 to ground through resistor $R_{10}$.

Each of the resistor pairs $R_8$ and $R_{13}$, $R_9$ and $R_{14}$, and $R_{10}$ and $R_{15}$ act as a voltage divider. These resistor pairs are selected to have different values, such that the potential at each of the nodes 40, 42, and 44 will be different. Accordingly, the diodes 32, 34, and 36 will become conductive at different magnitudes of the voltage on line 30. By properly selecting the values of the resistors, it is possible to shape the delinearized signal ($V_2$) to have the desired non-linear characteristic, as illustrated in FIG. 7.

As the magnitude of the voltage on line 30 increases above a first level, diode 32 will be rendered conductive because node 40 is held at a relatively low potential due to the values of $R_8$ and $R_{13}$. Thus, a portion of the voltage on line 30 will be shunted to ground. As the magnitude of the voltage on line 30 increases above a second level, diode 34 will also become conductive because node 42 is held at a potential higher than node 40, due to the values of $R_9$ and $R_{14}$, such that a greater proportion of the voltage on line 30 is shunted to ground. As the magnitude of the voltage on line 30 increase to a third level, diode 36 will also become conductive because node 40 is held at a higher potential than node 42, due to the values of $R_{10}$ and $R_{15}$. Consequently, an even greater proportion of the voltage on line 30 will be shunted to ground. In this way, by the proper selection of the resistance values, the curve is shaped in the desired manner by selectively grounding line 30 at different voltage magnitudes.

Line 30 is provided with a fourth diode 46, connected between it and ground. Diode 46 is, however, connected in the opposite direction as compared to diodes 32, 34, and 36. Diode 46 acts to protect the positive input of a third operational amplifier 48 from becoming negative.

The positive input of operational amplifier 48 is connected to line 30. The negative input of operational amplifier 48 is connected in feedback relation with the output of the amplifier. With this manner of connection, operational amplifier 48 does not alter the signal applied to the positive input, but acts only to isolate the delinearization circuit from the remainder of the driver.

The output of operational amplifier 48 is connected through resistor $R_{16}$ to the positive input of a differential amplifier 50. The positive input of differential amplifier 50 is also connected to ground through resistor $R_{17}$. The negative input of differential amplifier 50 is connected to the output of operational amplifier 26 through a resistor $R_{18}$ and in feedback relation to its output through resistor $R_{19}$.

Thus, differential amplifier 50 receives, at its negative input, a signal ($V_1$) which is a linear function of the input voltage (V) (adjusted in accordance with temperature compensating thermistor 28), and at its positive input, a signal ($V_2$) which is a non-linear function of the output of operational amplifier 26. Differential amplifier 50 acts to subtract these signals to obtain an output voltage which is applied to line 52.

Line 52 is connected to the negative input of a fourth operational amplifier 54 through a resistor $R_{20}$. The positive voltage source is connected to the negative input of operational amplifier 54 through a resistor $R_{21}$. The positive input of operational amplifier 54 is connected to the positive voltage source through resistor $R_{22}$ and to ground through resistor $R_{23}$.

Resistor pairs $R_{20}$, $R_{21}$ and $R_{22}$, $R_{23}$, in conjunction with the positive voltage source, serve to maintain the inputs of operational amplifier 54 at equal potentials when the output of differential amplifier 50 is zero volts. When the potential at both inputs of operational amplifier 54 are equal, the output of the amplifier ($V_{out}$), which is connected to the control input of the current source 16, will be zero volts. Thus, when the output of differential amplifier 50 is zero volts, the control current $I_o$ will always be zero.

This is accomplished through the proper selection of the values of resistors $R_{20}$, $R_{21}$, $R_{22}$ and $R_{23}$. More specifically, the values of these resistors are selected such that the ratio of the values of the first pair ($R_{20}$, $R_{21}$) is substantially equal to the ratio of the value of the second pair ($R_{22}$, $R_{23}$).

For example, assume that $R_{20} = R_{21}$ and $R_{22} = R_{23}$. This, the ratio of the first pair equals the ratio of the second pair because both ratios equal one. If the output of amplifier 50 is zero volts (that is, both $V_1$ and $V_2$ are zero volts), the negative input of amplifier 54 will be at 7.5 volts and the positive input of amplifier 54 will be at 7.5 volts. Accordingly, the output ($V_{out}$) of amplifier 54 will be zero volts.

The current source includes a first transistor $Q_1$ and a second transistor $Q_2$, each of which has a control terminal and an output circuit. The control terminal of transistor $Q_1$ is connected to the output of amplifier 54 through a resistor $R_{24}$ and to ground through resistor $R_{25}$. The control terminal of transistor $Q_1$ is connected to ground through a resistor $R_{26}$ and to the positive voltage source through a resistor $R_{27}$. The collector of transistor $Q_1$ is connected to the collector of transistor $Q_2$ which, in turn, is connected to node 60 between resistors $R_{22}$ and $R_{23}$. The emitter of transistor $Q_1$ is connected to the control terminal of transistor $Q_2$ and through resistor $R_{29}$ to the emitter of transistor $Q_2$ which, in turn, is connected to node 56. Node 56 supplies from node 60 the attenuator control current $I_o$ which is applied to the input of the PIN diode of the attenuator.

The curvature of the resulting V versus $I_o$ characteristic illustrated in FIG. 8 is primarily determined by the selection of the resistance values for resistors $R_1$, $R_5$, and $R_{10}$. The proper selection of these resistance values will result in the required characteristic.

As mentioned above, the problems associated with temperature variations are compensated for through the use of thermistor 28 in the input stage of the driver. It has been determined experimentally that the attenuation versus control current characteristic changes position as the ambient temperature varies, but that the shape of the curve remains very much the same throughout the normal operating temperature range, as seen in FIG. 9. Thus, K (the ratio of $a_1$ to $a_2$) remains substantially constant for any given value of output current $I_o$. In other words, K is a constant, independent of the control current $I_o$ throughout the temperature range. Accordingly, thermistor 28 can be employed in the input section of the driver such that the input voltage (V) automatically gets compensated at that point by the factor K. Since the attenuation is proportional to the driver input voltage V, the implementation of thermistor 28 is very simple, works for all input voltages, and reliably compensates for a wide range of temperature variations ($-55°$ C. $-+71°$ C.).

The problems associated with power supply variations are minimized by using only a single positive voltage supply to perform all of the transformations in the driver. A separate positive voltage supply may be provided, but only to provide power for the operational amplifiers.

It will now be appreciated that the present invention relates to a driver for a voltage controlled attenuator which is operational in the microwave range. The driver provides a stable, temperature compensated current for the PIN diode of the attenuator. No tuning of the circuit is required because zero dB attenuation is inherently achieved at zero volt input voltage, through the structure of the circuit. The thermistor placed at the input stage of the driver is simple to implement and reliably compensates for temperature variations over a wide range. Deviations due to power supply variations are reduced to a minimum through the utilization of a single power supply for all transformations. Moreover, the shape and slope of the output signal can be varied by simply varying the values of certain resistors in the driver.

While only a single preferred embodiment of the present invention has been disclosed herein for purposes of illustration, it is obvious that many variations and modifications could be made thereto. It is intended to cover all of these variations and modifications which fall within the scope of the present invention, as defined by the following claims:

We claim:

1. Apparatus for generating an output signal which is a non-linear function of an input signal, for use with a reference signal source, comprising: input means for receiving an input signal of a first magnitude, said input means having an output; means for forming a signal of a second magnitude which is a non-linear function of the input signal, said non-linear signal forming means comprising means, responsive to the signal level at said input means output and effective, when actuated by a signal level exceeding a preselected magnitude, for operably connecting said output of said input means and the reference signal source; and means for forming a signal which is a function of the difference between said first and said second magnitude, said difference signal comprising said output signal, said connecting means comprising resistance means, means having a first terminal operably connected to said output of said input means, and a second terminal operably connected to the reference signal source through said resistance means, and being adapted to become conductive when the potential at said first terminal and the potential at said second terminal are in a given relationship, and wherein said apparatus further comprises means for establishing the potential at said second terminal.

2. The apparatus of claim 1, wherein said means having a first terminal and a second terminal comprises a diode.

3. The apparatus of claim 1, wherein said connecting means further comprises second resistance means, second means, having a first terminal operably connected to said output of said input means and a second terminal operably connected to the reference signal source through said second resistance means, and being adapted to become conductive when the potential at said first terminal and the potential at said second terminal of said second means are in a given relationship, and means for establishing the potential at said second terminal of said second means.

4. The apparatus of claim 1, wherein said input means comprises an input node operably connected to receive the input signal and means for isolating said non-linear signal generating means from said input node.

5. Apparatus for generating a control signal for a non-linear signal attenuator or the like, the control signal being a non-linear function of an input signal, for use with a reference signal source, said apparatus comprising: input means, said input means comprising means for receiving said input signal and an output; means for sensing temperature and for altering said input signal in accordance with said sensed temperature; means for forming a signal which is non-linear function of said altered input signal, said non-linear signal forming means comprising diode means responsive to the signal level at said input means output for operably connecting said output of said input means with the reference source when said signal level exceeds a given magnitude; means operably connected to receive said altered input signal and said non-linear signal for forming a signal which is a function of the magnitude of the difference therebetween; and output means operably connected to said difference signal forming means to form the control signal as a function of said difference signal.

6. The apparatus of claim 5, for use with a signal controlled current source having an output node and including transistor means having a control terminal and an output circuit and wherein said apparatus further comprises means for applying said output signal to said control terminal.

7. The apparatus of claim 6, wherein said output means further comprises means for generating a current and means for operably connecting said output circuit between said current generating means and the current source output node.

8. Apparatus for generating an output signal which is a non-linear function of an input signal comprising: means for sensing temperature, input means for receiving the input signal, said input means having an output and comprising means for altering the input signal in accordance with the sensed temperature; means, operably connected to said output of said input means, for forming a signal which is a non-linear function of the input signal; means for forming a signal which is a function of the magnitude of the difference between the input signal and said non-linear signal, the difference signal comprising said output signal.

9. The apparatus of claim 8, wherein said non-linear signal forming means comprises means, operably connected to said output of said input means, for delinearizing said input signal and means for isolating said delinearizing means from said difference signal forming means.

10. The apparatus of claim 8, wherein said means for forming said difference signal comprises a differential amplifier having first and second inputs operably connected to receive said input and said non-linear signals, respectively.

11. Apparatus for generating an output signal which is a non-linear function of an input signal comprising: input means comprising an input node operably connected to receive the input signal; means, operably connected to said input means, for forming a signal which is a non-linear function of the input signal; means for isolating said non-linear signal generating means from said input node; means, operably connected between said input node and said isolating means for sensing temperature and for altering the input signal in accordance with the sensed temperature; means for forming a signal which is a function of the magnitude of the difference between the input signal and said non-linear signal, said difference signal comprising said output signal.

12. Apparatus for generating an output signal which is a non-linear function of an input signal comprising: input means for receiving the input signal, said input means having an output; means, operably connected to said output of said input means, for forming a signal which is a non-linear function of the input signal; means for forming a signal which is a function of the magnitude of the difference between the input signal and said non-linear signal, said difference signal comprising said output signal, and further comprising output means for generating a zero output signal when said difference signal equals zero.

13. The apparatus of claim 12, wherein said output means comprises an operational amplifier having first and second inputs and means associated with said inputs for maintaining same at substantially equal potentials when said difference signal is zero.

14. The apparatus of claim 12, for use with a signal controlled current source having an output node and comprising transistor means having a control terminal and an output circuit and wherein said apparatus further comprises means for operably connecting said output means to said transistor control terminal.

15. Apparatus for generating an output signal which is a non-linear function of an input signal, for use with a source of positive voltage and a reference source, comprising: input means for receiving the input signal, said input means having an output; means, operably connected to said output of said input means, for forming a signal which is a non-linear function of the input signal; means for forming a signal which is a function of the magnitude of the difference between the input signal and said non-linear signal, said difference signal comprising said output signal, and further comprising output means, said output means comprising an operational amplifier having first and second inputs, first and second pairs of resistors, each of said pairs of resistors having a first resistor operably connected between a different one of said inputs and the positive source and a second resistor, said second resistor in one pair being operably connected between the reference source and one of said inputs and said second resistor in said other pair being operably connected between the output of said difference signal generating means and said other input.

16. The apparatus of claim 15, wherein the ratio of the values of the resistors in each of said pairs is substantially equal.

17. Apparatus for generating an output signal which is a non-linear function of an input signal, for use with a signal controlled current source comprising transistor means having a control terminal and an output circuit, comprising: input means for receiving the input signal, said input means having an output; means, operably connected to said output of said input means, for forming a signal which is a non-linear function of the input signal; means for forming a signal which is a function of the magnitude of the difference between the input signal and said non-linear signal, said difference signal comprising said output signal, and further comprising means for operably connecting said signal forming means to the transistor control terminal of the signal control current source.

* * * * *